United States Patent [19]

Fukunaka

[11] Patent Number: 5,109,382
[45] Date of Patent: Apr. 28, 1992

[54] METHOD AND APPARATUS FOR TESTING A MEMORY

[75] Inventor: Hidetada Fukunaka, Hadano, Japan

[73] Assignee: Hitachi, Ltd., Tokyo, Japan

[21] Appl. No.: 439,838

[22] Filed: Nov. 21, 1989

[30] Foreign Application Priority Data

Nov. 30, 1988 [JP] Japan .................. 63-302395

[51] Int. Cl.⁵ .............................................. G06F 11/00
[52] U.S. Cl. ................................ 371/21.1; 371/22.5; 365/201
[58] Field of Search ............... 371/21.1, 21.2, 21.3, 371/13, 15.1, 22.5; 365/201

[56] References Cited

U.S. PATENT DOCUMENTS

| | | | |
|---|---|---|---|
| 4,740,971 | 4/1988 | Tam | 371/21.2 X |
| 4,897,817 | 1/1990 | Katanosaka | 365/201 |
| 4,903,266 | 2/1990 | Hack | 371/21.2 |
| 4,905,142 | 2/1990 | Matsubara | 371/21.2 X |
| 4,951,254 | 8/1990 | Ontrop | 371/21.1 X |
| 4,956,818 | 9/1990 | Hatayama | 371/21.1 X |

FOREIGN PATENT DOCUMENTS 0263312 4/1988 European Pat. Off. .

*Primary Examiner*—Robert W. Beausoliel
*Attorney, Agent, or Firm*—Antonelli, Terry, Stout & Kraus

[57] ABSTRACT

Method and apparatus for testing a memory mounted on an information processing system which includes a processor and at least one memory device. The memory device has a built-in memory test capability. In testing the memory mounted on the system, a test using the built-in test capability is combined with an additional test using a normal write/read operation of the memory performed by the processor unit. While the test using the built-in test capability is performed over the entire memory addresses, the additional test is performed with limited addresses.

7 Claims, 1 Drawing Sheet

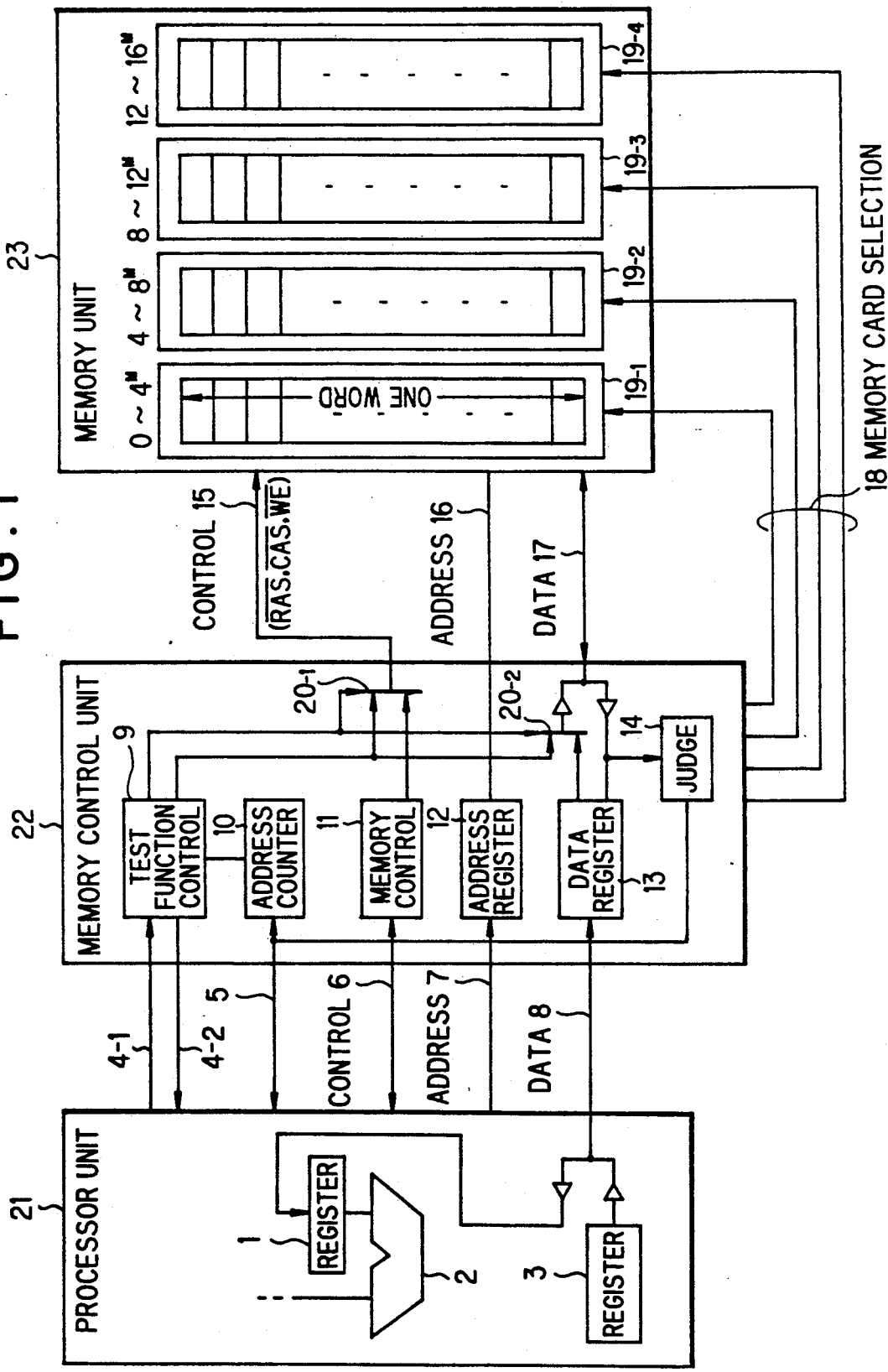

METHOD AND APPARATUS FOR TESTING A MEMORY

BACKGROUND OF THE INVENTION a. Field of the Invention

The present invention relates generally to a test of a memory, and more particularly to a method and an apparatus for testing memory devices mounted on a system, which is appropriate for computer terminals or small computer systems wherein users are subject to the influence of time required to boot the system.

b. Background Art

A prior art system having such memory testing function is disclosed, for example, in Japanese laid-open pat. No. 58-122700. This system has a main central processing unit (CPU) as well as another CPU or a sub-CPU. The sub-CPU is provided on a memory board to be dedicated to testing memory devices mounted on the system in order to reduce the time required for the test and to ease the load of the main CPU.

The prior art system has, however, the following disadvantages:
  i) The sub-CPU is necessary for each of the memory boards, resulting in increase of the amount of hardware.
  ii) Memory test by the sub-CPU is limited in speed because of the sequential operations of WRITE, READ, and VERIFY instructions from outside the memory devices.
  iii) The memory test covers only a memory access route used by the sub-CPU, leaving untested another access route (including deta, address and control signals) which is used in normal operation by the main CPU, degrading the reliability of the system.

SUMMARY OF THE INVENTION

It is, therefore, an object of the present invention to provide the method and the apparatus which accomplish a high-speed and reliable memory test with less amount of hardware.

According to the present invention, there is provided a method for testing a memory in an information processing system which includes a processor unit and at least one memory device having a built-in memory test capability, the method comprising the steps of entirely testing the memory using the built-in test capability under a condition that the memory is mounted on the system, and partially testing the memory through a normal memory access route used by the processor unit.

The step of partially testing the memory may comprise the steps of accessing, at least once, each of memory devices and activating the address bus and the data bus.

The step of activating the address bus and the data bus may comprise the step of causing each bit of the address bus and the data bus to be driven at high and low levels at least once.

According to another aspect of the present invention, there is provided a method for testing a memory in an information processing system which includes a processor unit and at least one memory device having a built-in memory test capability, the method comprising the step of combining a test using the built-in memory test capability and an additional test using normal write/read operations of the memory performed by the processor unit, the additional test being performed with limited addresses and data patterns of the memory to be tested.

The present invention also provides an apparatus for testing a memory under control of a processor wherein the memory includes at least one memory device having a built-in memory test capability, the apparatus comprising control means for controlling the built-in memory test function of the memory device, judging means for judging the result of a memory test using the built-in memory test function, accessing means for accessing the memory by the processor, an address register for storing an address of the memory to be tested, a data register for storing write data or read data, and switching means for switching between a first memory access route for a normal accessing by the processor and a second access route for accessing by the control means.

This apparatus may further comprise means for indicating a defective address in response to the output of the judging means. Also, this apparatus may be manufactured in the form of a large-scaled integrated circuit.

In recent years, a dynamic random access memory (DRAM) includes a high-speed built-in memory test capability, as the capcity of a memory increases, in order to reduce the time required to test DRAM chips. Such built-in test function tends to be available to users so that the test function is available even when the memory is mounted on the system, as taught in NIKKEI ELECTRONICS, pp. 149–157, Apr. 6, 1987 (no. 418).

The present invention utilizes the built-in memory test function of the DRAM. This enables the computer to examine quickly whether a memory under test is good or not. However, this test by itself is not sufficient to reveal any defect on the normal access route to be used by the processor. Therefore, an additional test is performed to test the normal access route. Since, the additional test is not directed to memory device itself but to the normal access route, a limited number of addresses is sufficient with limited paterns of data in the additional test, resulting in a quick and reliable memory test as a whole.

Specifically, upon receipt of a signal from a processor which initiates the built-in test function of the DRAM, memory control unit causes built-in test control means to test the memory over all address locations thereof and will return a report representative of the completion of the test to the processor when the test is finished. Instead, if any defect is detected, the memory control unit will return a report representative of detection of the defect. Thus, a high-speed memory test is accomplished with less amount of hardware.

Then, after switching a memory access route to establish a normal route for read/write operations by the processor, the above-mentioned additional test is performed with a limited combination of addresses and data patterns, providing wider coverage of memory tests and higher reliability.

The capacity of DRAM is increasing at a rate of four times per three years, and hence, the capacity of system memory is increasing. On the other hand, the read/write cycle time of DRAM is not anticipated to be so improved. This means that the time required for testing memories is increasing at the same rate as the increase of memory capacity.

In order to test x mega word memory under the condition stated hereinafter, it takes 2.4x seconds for a normal test using WRITE/READ/COMPARE instructions, while it takes only 0.5x seconds for a test using the built-in test function along with an additional normal test of limited patterns. The time required for the additional normal test is negligible.

If this calculation is applied to the DRAMs to be used six years in the future to a sixteen-times larger size of system, it could take as long as ten minutes with the prior art system to test the memory while only two minutes to test the memory with the present invention which will be still provide practical use with high reliability.

BRIEF DESCRIPTION OF THE DRAWINGS

FIG. 1 is a block diagram of an embodiment of the present invention.

EMBODIMENT

Referring to FIG. 1, there is shown a computer terminal or a computer system which comprises a processor unit 21, a memory control unit 22, and a memory unit 23.

The memory unit 23 includes four memory cards 19-1, 19-2, 19-3 and 19-4, each of which has a capacity of 4M words using a number of 4M-bit DRAM's, totally providing a capacity of 16M words.

The processor unit 21 comprises a central processor unit which accesses the memory unit 23 via the memory control unit 22. In the drawing, shown only the processor unit 23 are a read data register 1, an operational unit 2, and a write data register 3 which are associated with memory testing through a normal memory access route. A test program in the processor unit 21 controls the initiation of the built-in test function of DRAM, execution of the test through a normal memory access route, and processing of the result of tests, etc.

The memory control unit 22 comprises a built-in test function control circuit 9 which controls the built-in test function of DRAM under the control of processor unit 21, and an address counter 10 which is adapted to update the address to be tested, until any defect is detected in the test, to indicate the defective address. The memory control unit 22 also comprises a memory control circuit 11 which generates memory control signals, such as $\overline{RAS}$ (row address strobe), $\overline{CAS}$ (column address strobe), $\overline{WE}$ (write enable) or the like, to allow normal memory accessing by the processor unit 21. An address register 12 is provided to latch an address for memory accessing by the processor unit 21, and a data register 13 is provided to latch data transferred between the processor unit 21 and the memory unit 22. Further including in the memory control unit 22 is a judging circuit 14 for judging the result of test using the built-in test function and access route switching circuits 20-1 and 20-2 which switch a memory access route between one for normal accessing by the processor unit 21 and another for accessing by the built-in test function control circuit 9.

In order to initiate a memory test in booting the system, the processor unit 21 drives the memory control unit 22 by a signal 4-1 for initiating the built-in test function of DRAM in the memory unit 23. In response to the signal 4-1, the test function control circuit 9 starts the built-in test operation of the memory unit 23. To this end, first, the access route switching circuits 20-1 and 20-2 are controlled to establish a route for memory accessing by the built-in test function control circuit 9. Then, execution of a DRAM test mode is started. Procedures for the execution is defined by the specification of built-in test function of a particular DRAM to be used. One example is as follows:

The DRAM test mode is entered at a timing of so-called $\overline{CAS}$ before $\overline{RAS}$ control with a low level of $\overline{WE}$. Then, eightbits are tested in parallel at a time by so-called $\overline{RAS}$ before $\overline{CAS}$ control, and this test is repeated eight bits by eight bits.

One test cycle includes the steps of writing the same value into eight bit cells to be tested, reading data out of the cells and verifying the data. For example, in testing with write data '0', all '0' data retreived from the cells will produce an output '0', while even one '1' included in the data retreived will produce an output '1'.

Similarly, in testing with write data '1', all '1' data retreived will produce an output '1', while even one '0' included in the data retreived will produce an output '0'. This test mode is reset at a timing of $\overline{CAS}$ before $\overline{RAS}$ control with a high level of $\overline{WE}$.

The above-described test cycle is controlled by DRAM control signals ($\overline{RAS}/\overline{CAS}/\overline{WE}$) 15, address signal 16 and data signal 17 from the control circuit 9. Outputs of the test are judged by judging circuit 14 and if a defect is detected, the judging circuit 14 will terminate updating the address counter 10 and apply a report 5 representative of detection of the defect to the processor unit 21. In response to the report 5, the processor unit 21 recognizes the defective address by reading the address stored in the address counter 10. Thus, five hundred and twelve thousand times (=4M/8) of test cycles are repeated for test 4M words of one memory card. The test is sequentially repeated to memory cards 19-1, 19-2, 19-3 and 19-4 by controlling the memory card selection signal 18 to test totally 16M words of all memory cards, and then, a signal 4-2 representative of termination of the test is applied to the processor unit 21.

The test described so far is not sufficient because it does not cover a normal memory access route including control signal 6 between processor unit 21 and memory control unit 23, memory control circuit 11, address bus 7, address register 12, data bus 8 and data register 13. Therefore, it is necessary to access each of the memory devices at least once and to activate the address bus 7 and the data bus 8 through a normal memory access route. In this embodiment, for example, the following four addresses ①-④ and two data patterns (A), (B) are preferrably used.

① address '000000 H' (where 'H' indicates a hexadecimal.)
② address '400000 H'
③ address '800000 H'
④ address 'FFFFFF H'
(A) data pattern all '0'
(B) data pattern all '1'

All memory devices can be accessed by using the addresses ①-④, while address lines 7 and data lines 8 can be activated by using the addresses ①, ④ and data patterns (A) and (B). This test is performed through a normal memory access route by the steps of controlling the access route switching circuit 20-1, 20-2 to establish a normal access route, writing data stored in the write data register 3 into memories, reading the data out of the memories to store into the read data register 1, and checking the data by the operational unit 2.

Now assuming the following conditions to calculate the time required for the memory test according to this embodiment:

i) time for a test using the built-in test function:

200 ns/time (for 4M DRAM-80 ns)

ii) time for a memory write by the processor unit:
240 ns/time (on the assumption of 80 ns/machine cycle × 3 machine cycles)

iii) time for a test by the processor unit:
1200 ns/time (on the assumption of 80 ns/machine cycle × 15 machine cycles)

Under such conditions, time required for a test using the foregoing all '0'/ all '1' to 16M memories is calculated as follows:

$$(240 \text{ ns} \times 16M \times 2) + (200 \text{ ns} \times 16M \times 2/8) + (1200 \text{ ns} \times 4 \times 2) = 8.5 \text{ s}$$

The required time may be further reduced if an initializing function built in DRAM is available for writing all '0' data thereinto. In the prior art approach, the same test of using the all '0'/all '1' for all addresses will requires the following test time:

$$1200 \text{ ns} \times 16M \times 2 = 38.4 \text{ s}$$

This is approximately four times as long as the time required for the test according to the present invention.

Additional hardware needed for the present invention is mainly circuits for controlling the control signals for DRAM. Accordingly, a large amount of test time is reduced with less addition of hardware and with entire coverage of necessary memory tests.

I claim:

1. A method for testing a memory in an information processing system which includes a processor unit and at least one memory device having a built-in memory test capability, the method comprising the steps of:

conducting a test using the built-in memory test capability; and conducting an additional test using normal write-/read operations of the memory performed by the processor unit, the additional test being performed with a limited number of addresses and data patterns of the memory to be tested.

2. An apparatus for testing a memory under control of a processor wherein tne memory includes at least one memory device having a built-in memory test function, the apparatus comprising:

control means for controlling the built-in memory test function of the at least one memory device;

judging means for judging a result of a memory test using the built-in memory test function;

accessing means for accessing the memory by the processor;

an address register for storing an address of the memory to be tested;

a data register for storing write data or read data; and switching means for switching between a first memory access route for normal accessing by the processor and a second memory access route for accessing by said control means.

3. The apparatus according to claim 2, further comprising means for indicating a defective address in response to the output of said judging means.

4. An apparatus for testing a memory as in claim 2, wherein said at least one memory device is a DRAM.

5. A method for testing a memory unit mounted on an information processing system which includes a processor unit, said memory unit including at least one memory device having a built-in memory test capability, said at least one memory device including address locations and data buses, the method comprising the steps of:

testing said memory unit at every address location thereof by using the built-in memory test capability, while said at least one memory device is mounted on the information processing system; and testing said memory unit at said address locations thereof by using normal write/read operations performed by said processor unit in the information processing system while said at least one memory device is mounted on the information processing system.

6. The method according to claim 5, wherein the step of testing said memory unit at every address location includes accessing each of said at least one memory device at least once and activating each bit of said address locations and data buses of said at least one memory device.

7. The method according to claim 6, wherein the activating step includes activating each bit of said address location and data buses to a high and a low level at least once.

* * * * *